(12) United States Patent
Ahn et al.

(10) Patent No.: US 6,912,778 B2
(45) Date of Patent: Jul. 5, 2005

(54) METHODS OF FABRICATING FULL-WAFER SILICON PROBE CARDS FOR BURN-IN AND TESTING OF SEMICONDUCTOR DEVICES

(75) Inventors: Kie Y. Ahn, Chappaqua, NY (US); Jerome M. Eldridge, Los Gatos, CA (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 178 days.

(21) Appl. No.: 09/908,212

(22) Filed: Jul. 19, 2001

(65) Prior Publication Data

US 2003/0016036 A1 Jan. 23, 2003

(51) Int. Cl.[7] .................................................. H01K 3/10
(52) U.S. Cl. ............................. 29/852; 29/846; 427/97; 427/99; 438/14; 438/17; 438/18
(58) Field of Search .......................... 29/852, 846, 842; 427/97, 99; 438/17–18, 14

(56) References Cited

U.S. PATENT DOCUMENTS

| | | |
|---|---|---|
| 5,268,571 A | 12/1993 | Yamamoto et al. |
| 5,475,318 A | 12/1995 | Marcus et al. |
| 5,623,214 A | 4/1997 | Pasiecznik, Jr. |
| 5,642,054 A | 6/1997 | Pasiecznik, Jr. |
| 5,773,780 A | 6/1998 | Eldridge et al. |
| 5,806,181 A | 9/1998 | Khandros et al. |
| 5,829,128 A | 11/1998 | Eldridge et al. |
| 6,060,891 A | 5/2000 | Hembree et al. |
| 6,072,321 A | 6/2000 | Akram et al. |
| 6,100,708 A | 8/2000 | Mizuta |
| 6,143,616 A | 11/2000 | Geusic et al. |
| 6,181,144 B1 | 1/2001 | Hembree et al. |
| 6,187,677 B1 | 2/2001 | Ahn |
| 6,379,982 B1 | 4/2002 | Ahn et al. |
| 6,531,327 B2 * | 3/2003 | Kanamaru et al. ............ 438/17 |

OTHER PUBLICATIONS

FormFactor WOWs wieth Cost Savings, Electronic Buyer's News (EBUY), Copyright 1998 CMP Publications Inc., Dec. 14, 1998, pp. 7–9.

Beiley et al., A Micromachined Array Probe Card—Fabrication Process, IEEE Transactions on Components Packaging and Manufacturing Technology, Feb. 1995, Part B, vol. 12, No. 1, pp. 179–182.

Arnold et al., Test Methods Used to Produce Hightly Reliable Known Good Die (KDG), 1998 International Conference on Multichip Modules and Hight Density packaging, Dallas, TX, pp. 374–392.

Zhang et al., A New MEMS Wafer Probe Card, Newark, NJ, pp. 395–399.

(Continued)

*Primary Examiner*—Richard Chang
(74) *Attorney, Agent, or Firm*—TraskBritt

(57) ABSTRACT

A full-wafer probe card, a method for making the probe card and a full-wafer testing system are provided. The probe card includes test probes comprising cantilever elements configured and arranged with probe tips in a pattern corresponding to an array of bond pads of semiconductor dice residing on a device wafer. The probe card is desirably fabricated of the same material, such as silicon, as the device wafer to be tested. The cantilever elements may be fabricated from the material of the probe card substrate using known silicon micro-machining techniques including isotropic and anisotropic etching. Additionally, conductive feedthroughs or vias are formed through the probe card to electrically connect the probe tips with conductive pads on an opposing side of the substrate which interface with test contacts of external test circuitry. The conductive feedthroughs may be formed as coaxial structures, which help to minimize stray capacitance and inductance.

31 Claims, 7 Drawing Sheets

OTHER PUBLICATIONS

Smith et al, A New Flip–Chip Technology for High–Density Packaging, 1196 Electronic Components and Technology Confrence, pp. 1069–1073.

Jazairy et al., Very High Aspect Ratio Wafer–Free Silicon Micromechanical Structures, School of Electrical Engineering and the National Nanofabrication Facility, Cornell University, Ithaca, NY, SPIE vol. 2640, pp. 111–120.

Kasukabe et al., Membrane Probe with Pyramidal Tips for a Bare Chip Testing, 1998 International Conference on Multichip Modules and High Density Packaging, pp. 383–387.

Criscuolo, Using Silicon Contacts to Test and Burn–In FLASH Memory, Microprocessors, and FPGA's, 1998 International Conference on Multichip Modules adn High Density Packaging, pp. 388–392.

* cited by examiner

METHODS OF FABRICATING FULL-WAFER SILICON PROBE CARDS FOR BURN-IN AND TESTING OF SEMICONDUCTOR DEVICES

BACKGROUND OF THE INVENTION

1. Field of the Invention

The present invention relates generally to probe cards for testing of semiconductor dice. More specifically, the present invention relates to full-wafer probe cards suitable for use in burn-in and high frequency testing of such semiconductor dice.

2. State of the Art

The front-end process of ultra large-scale integration (ULSI) is often discussed in terms of Moore's law, which states that the number of transistors on a given silicon die will double every 18 to 24 months. Such rapid progress in front-end technology places significant pressure on back-end processes to keep pace. These back-end technologies may include, for example, burn-in, low and high speed testing, as well as dicing and packaging processes to transform the semiconductor dice as fabricated on a wafer or other large-scale substrate into individual devices.

In an exemplary Dynamic Random Access Memory (DRAM) manufacturing process, a finished wafer including a plurality of die locations thereon is singulated (diced) into individual component parts, each part comprising a single semiconductor die. Each semiconductor die is then placed into, for example, a small outline j-lead package (SOJ), a tape-automated small outline package (TSOP) or processed with minimal additional components into a die scale package (CSP). Once assembly of the individual packaged dice is completed, they are taken through preburn-in test, burn-in and final low- and high-speed testing.

In an effort to streamline back-end processes, many efforts have been focused on producing known good die (KGD) through implementation of test methods utilizing wafer probes. Such tests include voltage screens, usage of integrated circuit quiescent current ($I_{ddq}$) and temperature tests performed at the wafer level. Currently, the industry relies heavily on test carriers to burn-in and test singulated (diced) semiconductor dice to obtain a quality level for KGDs which consumers of the semiconductor dice desire and expect. However, test carrier methods are expensive, relatively slow and, in many cases, cost prohibitive.

One reason that more tests are not performed at the wafer level is that many of such tests require a large number of simultaneous, precise connections with each of the various dice locations on the wafer. In addition, a large number of power and signal input/output (I/O) paths between the dice locations on the wafer and test circuitry are required. For example, a wafer includes several hundred to well over a thousand semiconductor dice fabricated thereon, with each individual semiconductor die having numerous bond pads or contact locations. The total number of bond pads on the wafer is generally in the thousands. For some testing procedures, an I/O path must be provided to each bond pad on the die. Even with wafer stepping techniques, probe cards utilized in such testing usually do not include enough probes or contact bumps to effectively test groups of semiconductor dice on a wafer, each semiconductor die having a large number of contact locations. As integrated circuits become faster and ever-more complex, the number of I/O paths increases drastically, further exacerbating testing problems.

Since integrated circuitry density increases with die complexity, often in conjunction with static or even reduced die size, as the number of I/O paths increases the bond pads used to provide such contacts are reduced in size and pitch (spacing), making it more difficult to achieve dependable contacts using conventional test probe cards for die-sort testing. Traditionally, bond pads were placed at either the die periphery or along a center line thereof but, as the number of required bond pads increases, an array format for bond pads has become more common, such bond pad arrays further complicating probe card design.

Another significant problem in semiconductor device production exists in being able to quickly and reliably test and burn-in dice at an early stage of production without damaging bond pads located on the active surface of the die or the underlying electrical traces. This problem is demonstrated in the use of probe cards representative of the current state of the art.

Probe cards are conventionally used to contact the electrical pads of a wafer or one or more of the semiconductor dice located thereon, establish temporary electrical connection and perform one or more tests on the wafer or semiconductor dice through associated external circuitry. Often this is accomplished by contacting the bond pads of a semiconductor die, performing the test and then stepping the probe card to another semiconductor die on the wafer. In making electrical contact with the wafer surface, the probe card often performs a scrubbing action which allows for the electrical probes on the probe card to penetrate a thin metal oxide layer formed on the bond pads. In performing such a scrubbing action the probes, often in the form of a needle probe, may become displaced such that alignment of the probe tips, both vertically and laterally, becomes less and less accurate with time and use.

Additionally, in performing this aforementioned scrubbing action, a probe card may be overdriven, meaning that once contact is made between a probe and a bond pad on the wafer, the probe is pressed even further into the wafer in order to deflect the probes laterally across the contact pad to scrape the oxide layer. As transistor density increases, the size of each bond pad typically decreases along with the pitch or spacing between the bond pads and the metal thickness of the bond pad itself. Smaller bond pads result in a higher likelihood of piercing through the metal surface of the bond pad with a probe tip during scrubbing, or possibly collapsing the bond pad and/or any underlying electrical trace. Decreased bond pad pitch or spacing also means that less lateral movement by the probe for a scrubbing action will be allowed.

In an effort to deal with such issues, the industry has pursued various alternative techniques. One technique used to deal with probe alignment issues is the use of membrane type probe cards. Membrane probe cards are typically formed of a thin and flexible dielectric material such as polyimide. Contact bumps are formed on the membrane in electrical communication with conductive traces carried by the card. The conductive traces are electrically connected to external test circuitry which implements, controls and records the testing.

In general, membrane probes are able to compensate for vertical misalignment between the contact locations on the wafer. In effecting such alignment, membrane probes typically utilize a force applying mechanism which allows the contact bumps to penetrate the oxide layer on the bond pads. Membrane probes typically substitute this penetrating action for the scrubbing technique used with needle-type probes in order to penetrate the oxidation layer of a die's bond pads.

One disadvantage of such membrane probes is that vertical overdrive forces are required to achieve penetration of the probe through the oxide layer and associated electrical contact. Such vertical forces can damage the bond pads on the wafer and possibly the underlying traces. As noted above, with increased density of electrical I/O contacts in the form of bond pads, and the inherent reduction of their size and spacing, the likelihood of damage to the bond pads is also increased.

Another disadvantage of membrane probe cards is the disparate rate of thermal expansion between elements of the probe card and a wafer. For example, due to disparate coefficient of thermal expansion (CTE), copper traces on the probe card will expand and contract at a significantly different rate than the semiconductor material of the wafer as a result of temperature fluctuations during testing. The mismatch of thermal properties may cause alignment problems between a probe card and semiconductor die, particularly during high temperature testing such as is conducted during burn-in.

Additionally, traditional methods of utilizing probe cards for interfacing a wafer or semiconductor die location thereon with a tester introduce parasitic capacitance and stray inductance, each of which prevents a die under test from being tested at its design speed. This deficiency allows for testing and qualification of semiconductor dice as functional, but which fail, undetected, to meet speed requirements. Thus, such semiconductor dice are further processed and packaged, only to be scrapped at a later time when the operational speed deficiency is discovered. Such problems resulting from ineffective test procedures will only be exacerbated in the future as semiconductor devices continue to increase in speed as well as in density of transistors for a given semiconductor die. Because scrapping or reworking finished (packaged) dice that do not meet speed requirements is prohibitively expensive, it will be desirable to test multi-chip modules such as memory modules at normal operational speed and then replace the speed-deficient dice which may have otherwise tested as functional. To further complicate problems, the output drivers of the semiconductor dice will be downsized in anticipation of reduced parasitics between dice, with an attendant reduction in effectiveness in driving the probe card and tester. Thus, accurate sorting of semiconductor dice at the wafer level would save significant packaging cost.

In view of the shortcomings in the art, it would be advantageous to provide a full-wafer probe card affording higher speeds and higher resolution, and which is suitable for high-temperature burn-in testing on a wafer scale, prior to die singulation and packaging. In addition, it would be desirable to employ probe cards which place less of a load on the output drivers of a device under test. It would also be advantageous to provide a probe card which may be fabricated in commercial quantities with processes which are well known and utilized in the formation of integrated circuits. Further, it would be advantageous to provide a probe card which minimizes stray capacitance and inductance allowing for high frequency testing under real operating conditions.

BRIEF SUMMARY OF THE INVENTION

One aspect of the invention includes a method of fabricating test probes for a probe card. The method includes providing a substrate of semiconducting material and forming an integral cantilever element from a portion of the substrate material. A conductive tip is formed at or near the distal end of the cantilever element. A conductive pad is formed on the substrate and the conductive pad is electrically coupled to the conductive tip.

A method of fabricating a probe card is similarly disclosed. The probe card is fabricated by forming a plurality of probes from a substrate of semiconducting material with each probe including a cantilever element integral with the substrate and a conductive tip on the distal end of each cantilever element as set forth above. A plurality of conductive pads are formed on the substrate and each conductive tip is electrically coupled an associated conductive pad.

In accordance with another aspect of the invention, another method of forming a probe card is disclosed. The method includes providing a substrate of semiconducting material and having a first major surface and a second major surface. A portion of the substrate is etched to form at least one cantilever element which is integral with the substrate. At least one channel or via defining a location of a conductive feedthrough is formed through the substrate from the first major surface to the second major surface thereof. An electrically insulative (dielectric) layer may be formed over the at least one cantilever element, over an interior surface of the channel and over at least a portion of the first major surface of the substrate between the cantilever element and the channel. Conductive metal is deposited over the insulative layer including over the cantilever element, within the channel and between the cantilever element and channel. A conductive tip is formed at or near a distal portion of the cantilever element and contiguous with the conductive metal. A conductive pad is formed on the second major surface of the substrate and is placed in electrical communication with the conductive metal deposited in the channel, thus connecting the conductive tip with the conductive pad. The conductive pad may comprise an exposed end of the conductive material within the channel or be located offset from the channel and electrically connected thereto by a conductive trace. The feedthrough may comprise a coaxial structure including an outer conductive layer, an insulative layer lying therewithin and an inner conductive layer, such structures facilitating high speed testing procedures.

Another aspect of the invention includes a probe card. The probe card includes a wafer of semiconducting material carrying at least one probe. The probe includes a cantilever element formed from and integral with the wafer material and having a conductive tip at or near the distal end of the cantilever element. The probe card further includes at least one conductive pad which is in electrical communication with the conductive probe tip and is configured for connection with external circuitry. A conductive via, and more particularly a conductive via formed as a portion of a coaxial conductive structure extending through the wafer from one major surface thereof to an opposing major surface may be provided as part of an electrical connection between the conductive probe tip and the conductive pad.

In accordance with yet another aspect of the invention, a wafer level testing system is provided for high speed and burn-in type testing of a plurality of unsingulated semiconductor dice residing on a wafer. The testing system includes a probe card formed of a semiconducting wafer. At least one probe is carried by the wafer and includes an integral cantilever element formed from the wafer material and having a conductive tip at or near the distal end of the cantilever element. The probe card further includes at least one conductive pad which is in electrical communication with the at least one conductive probe tip. Test circuitry is operatively coupled to the at least one probe pad through the at least one conductive pad allowing for testing of an I/O bond pad of a semiconductor die located on a wafer via the probe.

BRIEF DESCRIPTION OF THE SEVERAL VIEWS OF THE DRAWINGS

The foregoing and other advantages of the invention will become apparent upon reading the following detailed description and upon reference to the drawings in which.

DETAILED DESCRIPTION OF THE INVENTION

Figure 1:
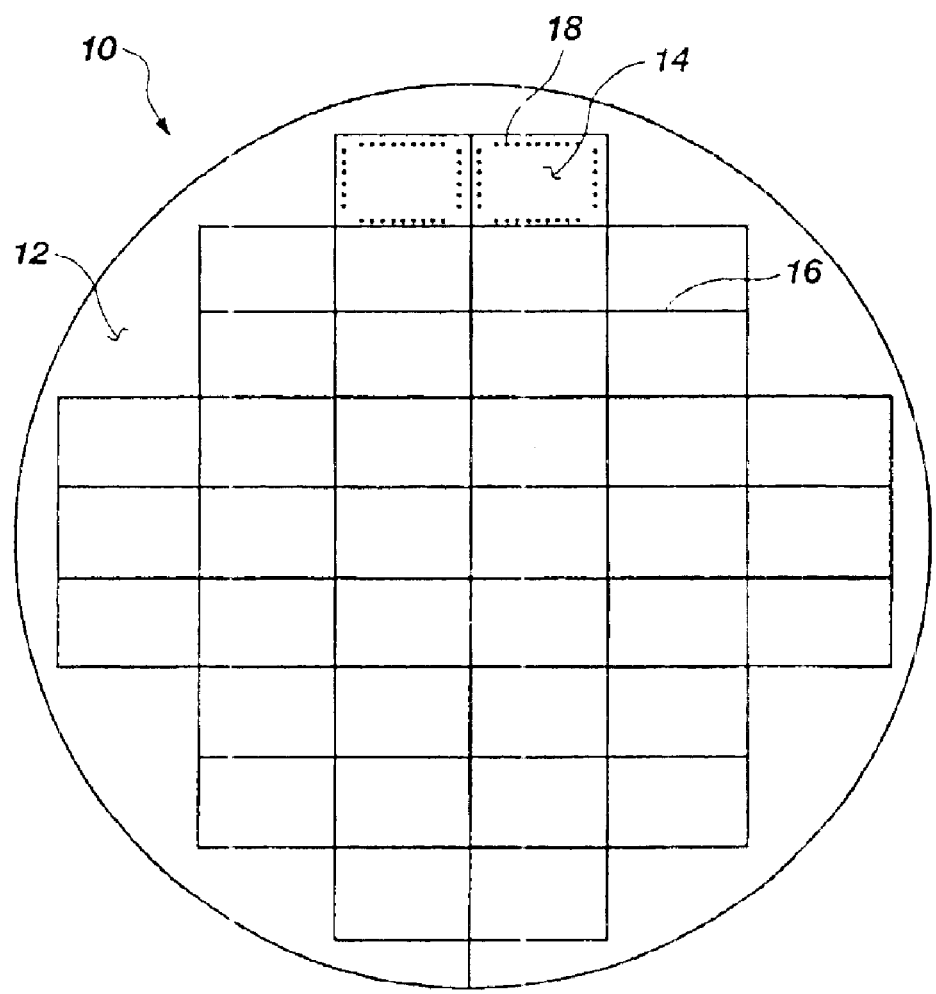
FIG. 1 is a top view of a prior art device wafer.

Referring to FIG. 1, a device wafer 10 is shown, and particularly the active surface 12 of the device wafer 10. As used herein, the term "device wafer" means a substrate formed of, or covered with a layer of a semiconductor material and may comprise a conventional, substantially circular wafer or other large substrate on which a plurality of semiconductor dice are fabricated. The device wafer 10 may be comprised of any suitable semiconductor material such as silicon, geranium, silicon geranium, gallium arsenide, indium phosphide, selenium, tellurium or any other suitable semiconductor material. The device wafer 10 includes a plurality of yet to be singulated semiconductor dice 14, the locations of which are individually distinguishable from each other by way of interpositioned scribe lines 16, commonly referred to as "streets." The row and column pattern of unsingulated dice 14 depicted in FIG. 1 is typical; however, any suitable die pattern may be utilized in practicing the present invention. Ultimately, such semiconductor dice 14 will be cut, or diced, along scribe lines 16 by a diamond saw or by other techniques known in the art.

Each semiconductor die 14 includes a plurality of electrical I/O contacts comprising bond pads 18. The bond pads 18 are arranged in a pattern or array according to predetermined design criteria for the semiconductor die 14 in question. It is noted that in FIG. 1 the bond pads 18 are positioned about the periphery of each die 14 (i.e., adjacent each die's respective circumscribing scribe lines 16). However, as shall be discussed further below, such a pattern is not to be considered limiting in any sense with regard to the present invention. Further, it is noted that the term "bond pad" as used herein encompasses not only bond pads directly connecting with underlying integrated circuitry but also bond pads which are rerouted laterally on an active surface of a semiconductor die 14 to new locations, for example from a peripheral bond pad arrangement suitable for wire bonding to a lead frame to a two-dimensional array of bond pads suitable for fabrication of a flip-chip device.

Figure 2A:
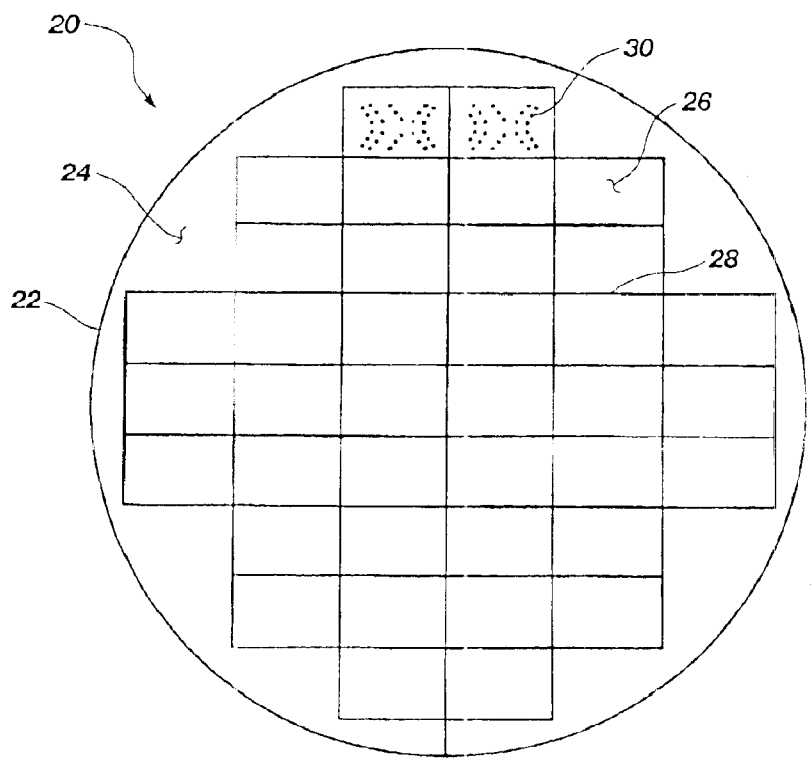
FIGS. 2A and 2B show top and bottom views, respectively, of a probe card according to one embodiment of the present invention.
Figure 2B:
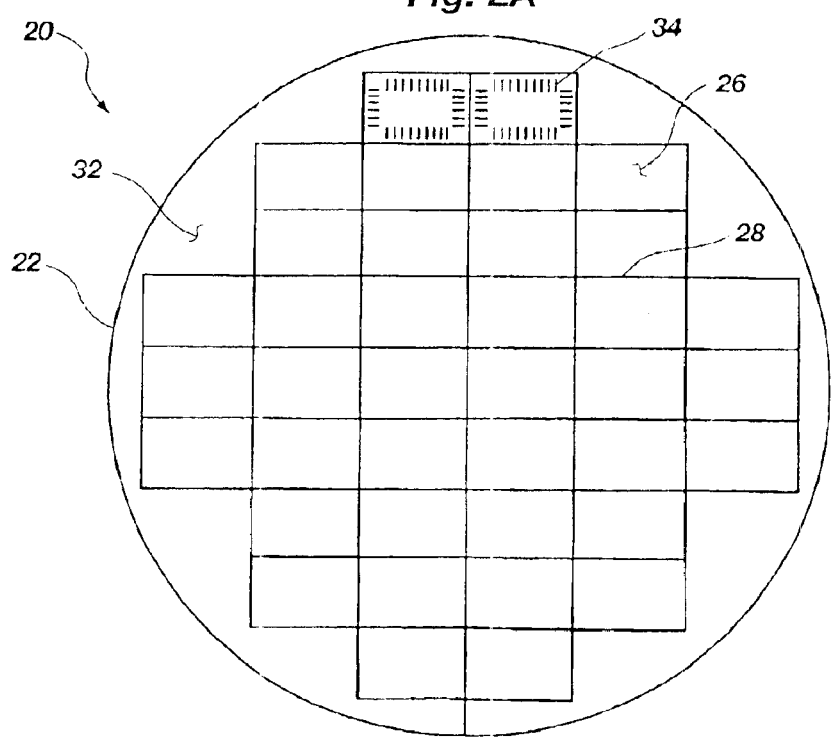

Referring to FIGS. 2A and 2B, a probe card 20 according to the present invention is shown for use in testing of the device wafer 10. The probe card 20 is formed of a semiconductor substrate 22, which is desirably a wafer formed of the same material and in a similar manner as the device wafer 10. Indeed, it is desirable to utilize a wafer which was intended as a device wafer 10 but which failed to pass specific quality standards thus rendering it unusable as a device wafer 10. FIG. 2A shows the back surface 24 of the probe card 20 which is separated into die regions 26. The die regions 26 are configured in size and pattern of arrangement to correspond with size and pattern of arrangement of the unsingulated dice 14 of the device wafer 10. Scribe lines 28 are shown to separate the die regions 26 and, while such may be formed in the substrate 22 (for example, in a subsequently rejected device wafer 10 prior to being selected and processed as a probe card 20), the scribe lines 26 are largely illustrative and shown for clarity in identifying the individual die regions 26.

Each die region 26 includes a plurality of conductive pads 30 which serve as contacts for connection of the probe card 20 to external testing circuitry as shall be seen below. The front surface 32 of the probe card 20, as seen in FIG. 2B, shows a plurality of cantilever elements 34 formed within each die region 26. The cantilever elements 34 are arranged and positioned to have the locations of distal ends thereof correspond with the bond pads 18 of the semiconductor dice 14 of the device wafer 10 in order to facilitate electrical contact with the bond pads 18 during various testing procedures.

Figure 3A:
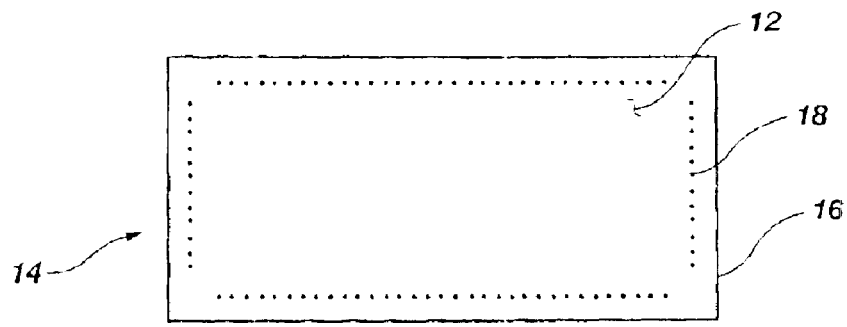
FIG. 3A shows a die section of the device wafer of FIG. 1.
Figure 3B:
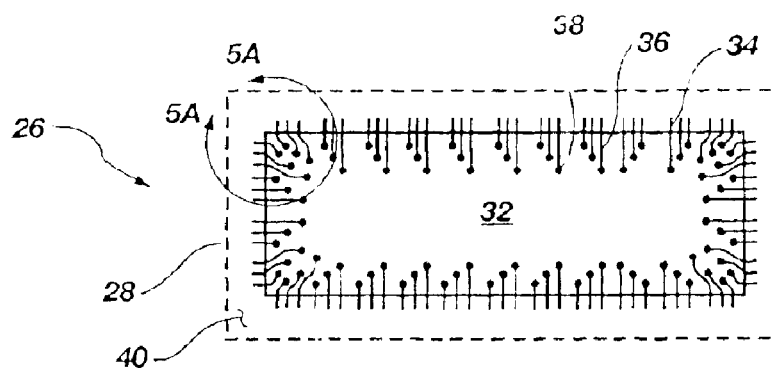
FIG. 3B shows the top view of a die region of the probe card of FIGS. 2A and 2B.
Figure 3C:
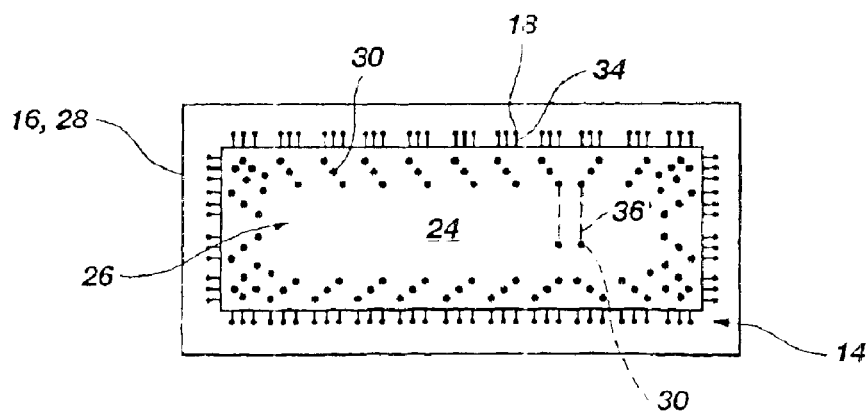
FIG. 3C shows the bottom view the of die region of FIG. 3B superimposed on the die section of FIG. 3A.

Referring to FIGS. 3A through 3C, an individual semiconductor die 14 of the device wafer 10 and an individual die region 26 of the probe card 20 (not shown) are each shown in greater detail. It is noted that while the individual semiconductor die 14 and the die region 26 are shown as discrete components, such depiction is for purposes of clarity and convenience. While the present invention may be implemented at the discrete component level, the advantages of implementing the invention at the wafer level are readily apparent to those of ordinary skill in the art.

The semiconductor die 14 is shown in FIG. 3A defined by its circumscribing streets 16 and having a plurality of bond pads 18 on the active surface 12 and arranged in a pattern about the die's periphery. As seen in FIG. 3B the front or probe surface 32 of the die region 26 is shown. The die region 26 includes a plurality of cantilever elements 34 about its periphery. The cantilever elements 34 are connected to conductive traces 36 disposed on the front surface 32 of the die region 26 and are electrically coupled with a conductive feedthrough or via 38. An etched, recessed region 40 is also shown inside the scribe lines 28 of the die region 26. The etched, recessed region 40 is a result of the process of forming the cantilever elements 34 as shall be discussed in greater detail below.

FIG. 3C depicts the back surface 24 of the die region 26 as it is superimposed on top of the semiconductor die 14. The plurality of conductive pads 30 are in electrical communication with the conductive feedthroughs 38, thus creating a plurality of electrical paths from the front surface 32 to the back surface 24 of each die region 26 on a probe card 20. As can also be seen in FIG. 3C, the cantilever elements 34 align with the die bond pads 18 and are in contact therewith. Thus, the conductive pads 30 act as contact points for testing circuitry and facilitate the connection of such testing circuitry to the bond pads 18 of the device wafer 10 via the probe card 20 as is discussed in greater detail below.

Figure 4A:
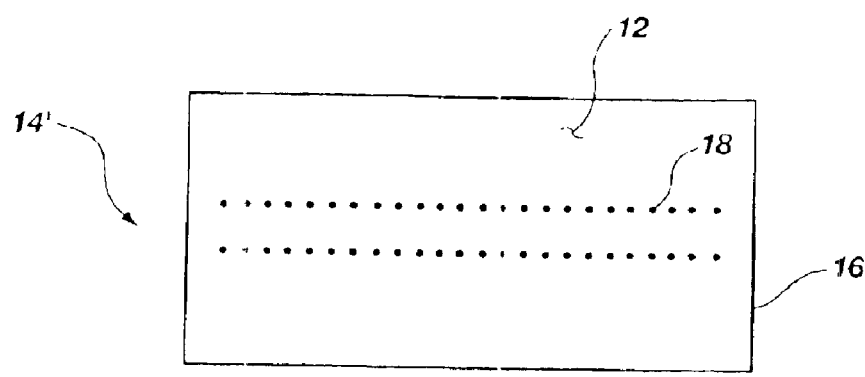
FIGS. 4A through 4C are alternative embodiments of the die section and die regions shown in FIGS. 3A through 3C.
Figure 4B:
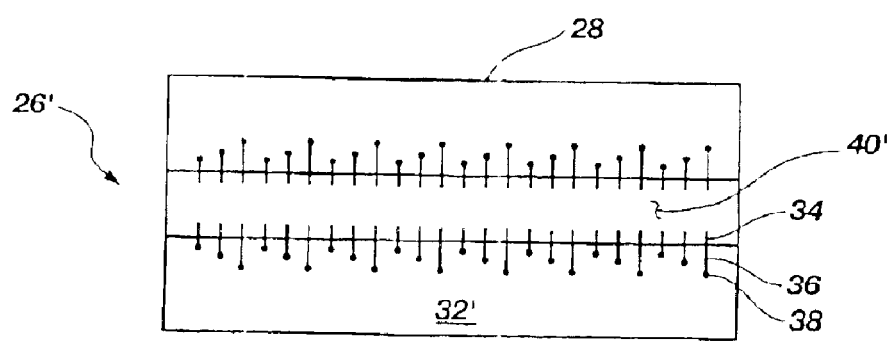
Figure 4C:
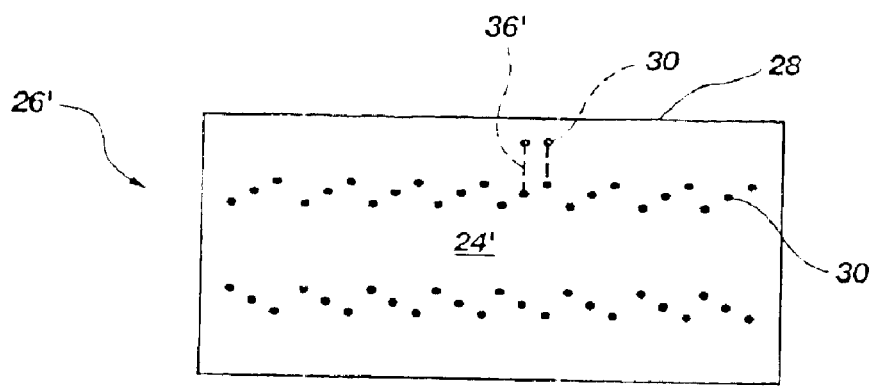

Referring briefly to FIGS. 4A through 4C, an alternative arrangement is shown in that the semiconductor die 14' and corresponding die region 26' for a probe card 20' (not shown) are shown to include alternative patterns of bond pads 18 and cantilever elements 34. The semiconductor die 14' includes a plurality of bond pads 18, but in this instance they are not arranged along the periphery of the die 14'. Rather, the bond pads 18 are located in two substantially parallel rows adjacent a longitudinal centerline of the die 14'. The die region 26' likewise is configured with the cantilever elements 34 formed on its front surface 32' in two substantially parallel, facing rows adjacent the longitudinal centerline of the die region 26'. The etched, recessed region 40' of probe card 20' is formed in a different location than the peripheral etched, recessed region 40 of probe card 20 and lies between the two rows of cantilever elements 34. Again, the etched, recessed region 40', how it is formed and the purpose it serves shall be discussed in greater detail below. The back surface 24' of the die region 26' is shown to include the conductive pads 30 in similar fashion to the probe card embodiment described above, but exhibiting a different pattern which helps to accommodate the different positioning of the cantilever elements 34 and the die bond pads 18. It is noted that the alternative configuration depicted in FIGS. 4A through 4C is illustrative and serves to show the flexibility of the present invention in adapting to various patterns, configurations and designs of semiconductor dice 14 and device wafers 10, many other patterns, configurations and design of dice 14 and device wafers 10 being easily accommodated by the probe card of the present invention.

With reference to FIGS. 3B, 3C, 4B and 4C and as shown in broken lines on

FIGS. 3C and 4C, it is noted that additional conductive traces 36' may be formed on the back side 24 or 24' of a probe card 20 or 20' such that conductive pads 30 may be located and arranged to properly interface with existing testing circuitry patterns if so desired. Alternatively, conductive traces 36 could be arranged and configured on the front surface 32 of the probe card 20 such that conductive feedthroughs or vias 38 would be positioned to penetrate the back surface 24 of the probe card 20 in a desired pattern or arrangement corresponding to a pattern of arrangement of test contacts carried by a test head of existing test equipment. The ability to tailor the patterns of conductive paths used to extend from cantilever elements 34 used to contact bond pads 18 from the front surface 32 and extending to conductive pads 30 on the back surface 32 of a probe card 20 allows for greater flexibility in interfacing existing test circuitry with various arrangements or patterns of bond pads 18 at the wafer level.

Figure 5A:
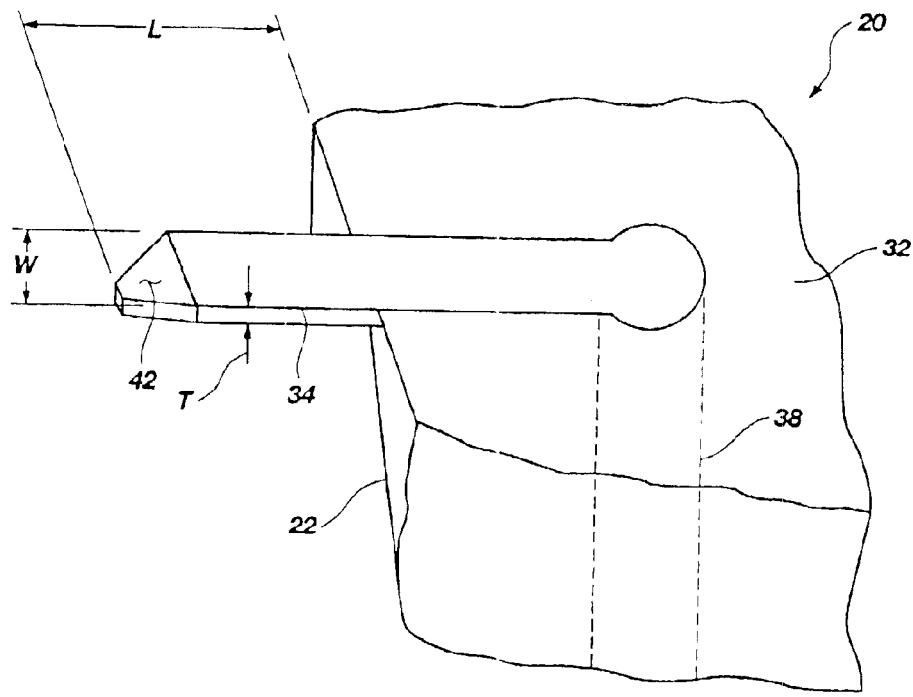
FIG. 5A shows a perspective of certain aspects of the invention including a cantilevered probe according to the section indicated in FIG. 3B.
Figure 5B:
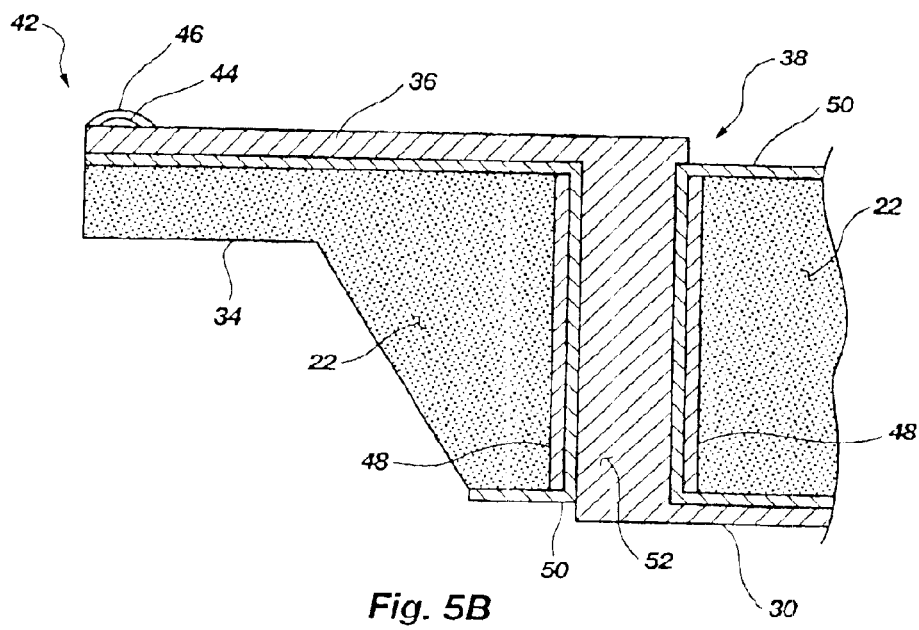
FIG. 5B shows a sectional view of the cantilevered probe of FIG. 5A.

Referring to FIGS. 5A and 5B, the structure of an individual cantilever element 34 and its associated components is shown. FIG. 5A depicts an individual cantilever element 34 in perspective view, while FIG. 5B depicts a longitudinal sectional view of the cantilever element 34 shown in FIG. 5A. FIGS. 5A and 5B both show cantilever element 34 and semiconductor substrate 22 in an orientation inverted from that in which they would be used for testing. The cantilever element 34 is formed on the front surface 32 of the probe card 20 from the semiconductor material of the substrate 22 and is oriented to extend away from a more substantial portion of the substrate 22, although in a substantially parallel plane thereto. The cantilever element 34 includes a conductive tip 42 at the distal end thereof for establishing physical and electrical contact with the bond pads 18 (not shown) of the semiconductor dice 14 residing on device wafer 10 (not shown). The cantilever element 34 is formed to have a length L, a width W and a thickness T of desired proportions. By way of example only and in keeping with current preferences only, the length L of the cantilever 34 may be in the range of 500 to 1000 $\mu$m (micrometers) with the width W being the same approximate width as a corresponding bond pad 18 of a semiconductor die to be tested, an exemplary width W being approximately 100 $\mu$m. The thickness T of the cantilever 34 may be varied according to various design parameters. For example, taking in consideration the length L and width W, a thickness T may be chosen for cantilever element 34 to impart a force of a desired magnitude at the conductive tip 42 to a contacted bond pad 18 of a semiconductor die 14. Similarly, as the cantilever element 34 is designed to flex upon contact between the conductive tip 42 and a corresponding contacted bond pad 18, the thickness may be designed in light of anticipated fatigue and repetitive stress so as to allow extended use of the probe card by reducing the likelihood of failure of individual cantilever elements 34, while still permitting sufficient flex to limit force applied to a bond pad 18 when a probe card 20 is placed in superimposition to a device wafer 10.

The conductive tip 42 is formed at or near the distal end of the cantilever element 34 and may be formed of multiple materials or layers of conductive materials. For example, as can be seen in FIG. 5B, the conductive tip 42 may include a first metal material 44 which may include a softer conductive material such as gold, alone or overlaid with a refractory metal 46, such as, for example, titanium. The latter construction allows for a softer and more yielding base metal to form the bulk of the conductive tip 42, with a harder material which will wear better during scrubbing of any oxide layers formed on the bond pads 18. Of course, other configurations of the conductive tip 34 may be suitable as well, including the use of a single layer of conductive material. Other suitable materials for forming the conductive tip 42 may include, for example, copper, silver or aluminum as the first metal material 44, and tungsten silicide or molybdenum as the refractory metal 46. Alternative geometrical configurations for conductive tip 42 may also be employed if so desired.

Figure 8:
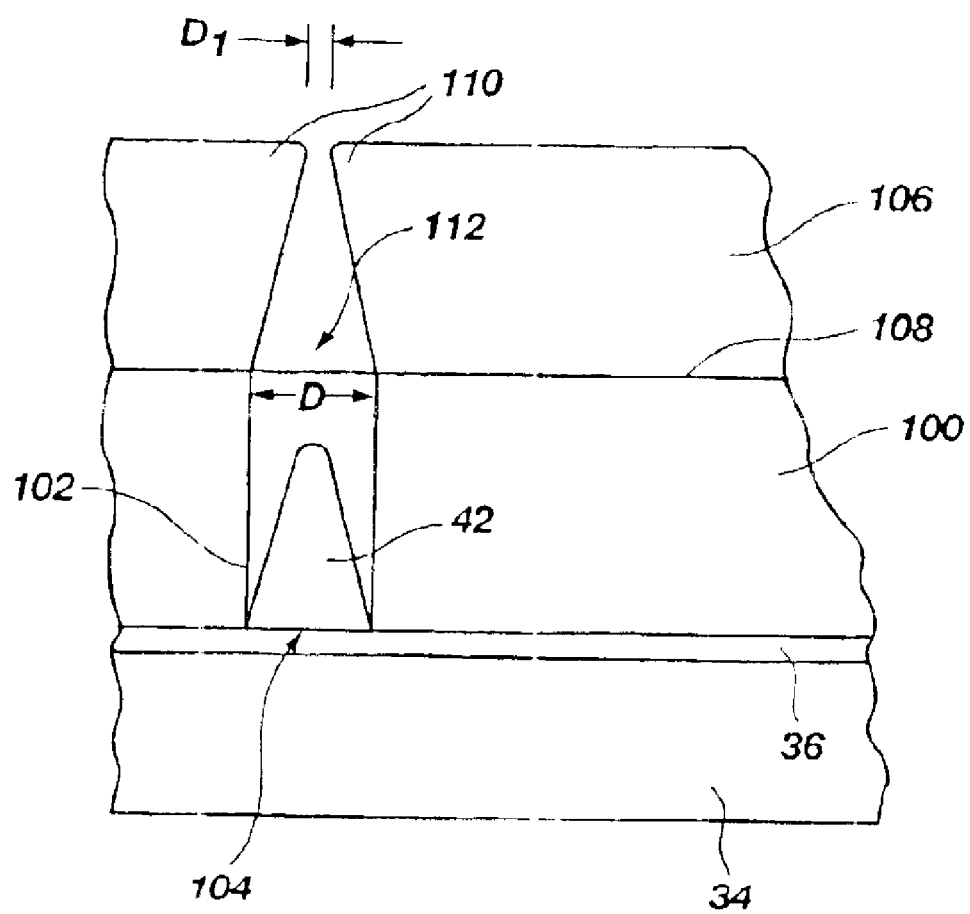
FIG. 8 is a schematic side sectional elevation illustrating one exemplary technique of forming conductive tips for the cantilevered probes of the present invention.

The conductive tip 42 may be fabricated by any of a variety of methods including, for example, electroplating, evaporation, or chemical vapor deposition. One method which may be desirably used in forming the conductive tip includes a lift-off technique, schematically illustrated in FIG. 8. The technique includes placing a thick layer of photo resist 100 over the front surface 32 (not shown) of the substrate 22 (not shown) and forming an opening 102 in the photo resist layer 100 above the region 104 where each conductive tip 42 of a cantilever element 34 is to be formed. One or more layers of metal 106 may then be evaporated over the photo resist layer 100 and the conductive tip 42 is formed of the evaporated metal which passes through the opening 102. As the evaporation continues, layers of metal 106 will accumulate on the surface 108 of the photo resist layer 100 and begin to overhang the opening 102 as shown at 110, reducing the diameter D of the effective mouth 112 thereof. As the evaporation progresses, the effective mouth 112 moves vertically upward and becomes more and more constricted with a smaller diameter $D_1$, thus passing less and less metal 106 and resulting in a substantially conical conductive tip 42. The overall height of the conductive tip 42 may be controlled by adjusting the thickness of the photo resist layer 100 used during fabrication. The photo resist layer 100 is subsequently lifted off, leaving the substantially conical conductive tip 42 on the cantilever elements 34. Such a method allows for simple fabrication of the conductive tip 42, including the use of multiple layers (i.e., 44 and 46) and further allows for a high degree of flexibility in designing the size and shape of the conductive tip 42 by manipulation of the thickness of photo resist layer 100, the size of opening 102 and the type and thickness or thicknesses of metals evaporated.

As seen in FIG. 5B, the conductive tip 42 is in electrical communication with the conductive trace 36 previously formed over cantilever element 34 and which in turn extends over the front surface end of conductive feedthrough 38 and is in electrical communication with the inner conductive layer 52 of conductive feedthrough 38. The conductive feedthrough 38 extends transversely through the substrate 22 between front surface 32 and back surface 24 and is in electrical communication with the conductive pad 30 on the back surface 24 of the probe card 20, either directly or through another conductive trace (not shown) extending over back surface 24. The conductive trace 36 and conductive probe pad 30 may be formed of any suitable conductive material, but is desirably a highly conductive metal such as, for example, aluminum.

The feedthrough 38 may be formed by methods well known in the art, and specifically by methods disclosed in U.S. Pat. No. 6,187,677, the disclosure of which patent is hereby incorporated herein by reference. This patent teaches formation of a high aspect ratio channel or via transversely through a semiconductor substrate, and the placement of conductive material within the channel or via. One aspect of the present invention includes employing a conductive element within feedthroughs 38 to electrically connect conductive tips 42 of cantilever elements 34 on front surface 32 of substrate 22 with conductive pads 30 on back surface 24 thereof. While a single conductive element may be used within feedthrough 38, it is currently preferred that feedthrough 38 may be fabricated as a coaxial interconnect structure which allows the probe card 20 to accommodate high frequency testing of the device wafer 10. The coaxial interconnect structure includes an outer conductive layer 48, which acts as a diffusion region. A dielectric layer 50 is formed inwardly and coaxially adjacent the outer conductive layer 48 and may be formed of a material such as, for example silicon dioxide. Dielectric layer, as shown in FIG. 5B, desirably also extends over front surface 32 and back surface 24 of substrate 22, including over the front surface side of cantilever element 34 to electrically isolate the conductive path formed between each conductive tip 42, through each feedthrough 38 and to each conductive pad 30 from the substrate 22. Inwardly adjacent the dielectric layer 50 is an inner conductive layer 52 which is in electrical contact with the conductive trace 36 and conductive pad 30 each being desirably formed of the same or similar material. A method of forming such a coaxial interconnect structure is set forth in U.S. Pat. No. 6,143,616, the disclosure of which patent is hereby incorporated herein by reference. This type of coaxial structure allows for high frequency signals to be transmitted under operating conditions corresponding to those of normal, i.e., real, operation of a semiconductor die 14 with minimized stray capacitance and inductance.

The cantilever elements 34 may be fabricated by silicon micro-machining techniques which utilize both isotropic and anisotropic etchants to sculpt three-dimensional structures in silicon. One example of forming a cantilever element 34 includes etching a trench in the front surface 32 of substrate 22 around at least a portion of what is desired to be the outline of a cantilever element 34, for example, around the distal end of the cantilever element 34, using an anisotropic etchant. An exemplary trench may have a depth of approximately 100 $\mu$m and a width of approximately 50 to 100 $\mu$m. After the trench has been etched to a desired width and depth, isotropic etching may be performed to remove silicon under (as shown in FIGS. 5A and 5B) the locations of cantilever elements 34 until the silicon is completely undercut and cantilever elements 34 result, each have a desired thickness T.

Some commonly used anisotropic etchants that may be used include potassium hydroxide (KOH), tetramethyl ammonium hydroxide (TMAH), and ethylene diamine-pyrocatechol (EDP). Etch rates vary depending upon the exposed crystal planes. However, etch rates in the <100> planes are typically 50 to 140 times those in the <111> planes.

Some commonly used isotropic etchants that may be used include hydrofluoric (HF)/nitric ($HNO_3$) mixtures and offshoots. Xenon difluoride ($XF_2$) is a popular dry etchant. If desired, an all dry etching method may be employed for the fabrication of the cantilever elements 34.

Figure 6:
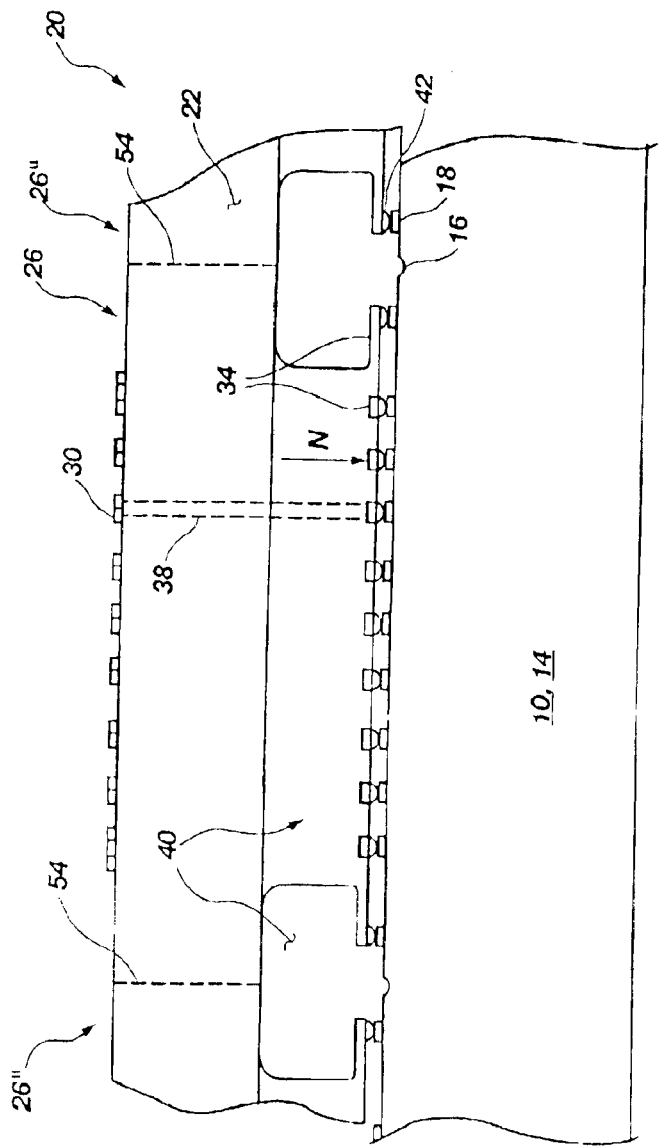
FIG. 6 shows a partial sectional view the probe card of FIGS. 2A and 2B cooperatively positioned with the device wafer of FIG. 1.

Referring to FIG. 6, a partial sectional view is shown of the probe card 20 disposed on the device wafer 10 for testing of the semiconductor dice 14 residing on device wafer 10. The probe card 20 as shown is sectioned parallel to the plane of the drawing sheet along a scribe line 28 (see FIG. 3B) of a die region 26 looking directly toward a plurality of cantilever elements 34, some of which extend in a direction out of the plane of the drawing sheet and others parallel thereto. The cantilever elements 34 are carried at the periphery of a pedestal defined peripherally when the cantilever elements 34 are etched from the semiconducting material of the substrate 22. Broken boundary lines 54 are shown on the probe card 20 to help indicate the location of individual die regions 26. A complete edge of a first full die region 26 is shown with partial die regions 26" located on either side of the full die region 26. Thus, FIG. 6 shows cantilever elements 34 for three different die regions 26. Etched, recessed regions 40 are also depicted in FIG. 6, indicating the area of material removal from the substrate 22 in the formation of the cantilever elements 34.

Still referring to FIG. 6, the probe card 20 is placed on the device wafer 10 and aligned according to techniques well-known and understood by those of ordinary skill in the art. Each cantilever element 34, and particularly each conductive tip 42 at or proximate a distal end of a cantilever element 34, is aligned with a corresponding bond pad 18 of an underlying semiconductor die 14. Upon placement of the probe card 20 on the device wafer 10, the probe card 20 may be overdriven a small amount to initiate a scrubbing action to occur with regard to penetrating any oxidation layer formed on the bond pads 18. The cantilever beam structure of the cantilever elements 34 of probe card 20 allows for a normal force N to be applied to the probe card 20 while absorbing much of the applied force N through the flexure and displacement of the individual cantilever elements 34. The cantilever elements 34 may flex in a vertical manner, which through a slight arcuate motion of the distal end of the cantilever where conductive tip 42 is located, allows for a small amount of lateral scrubbing motion to take place. However, since the displacement of the cantilever element 34 is substantially in a single plane (i.e. the vertical direction) due to the very slight arc traversed by the distal end during upward deflection, no lateral misalignment of cantilever elements 34 will result to compromise subsequent test procedures on other device wafers 10. Additionally, since the cantilever elements 34 are resilient, issues of planarity and the sequential alignment of a single probe card 20 with multiple device wafers 10 are resolved.

It is further noted that the integral nature of the cantilever elements 34 with the semiconductor material of substrate 22 and the fact that the probe card 20 including cantilever elements 34 is formed of the same or similar material as that of the device wafer 10 allows for testing at elevated temperatures without thermally induced stresses or misalignment of conductive tips with bond pads 18 under thermal cycling. Such thermal compatibility is particularly seen when the probe card 20 is fabricated from a wafer which was previously formed as a device wafer 10 but which failed to meet some specified criteria, resulting in scrappage thereof. Thus, with the probe card 20 and the device wafer 10 formed of the same material, and substantially by the same processes, any issues of mismatched coefficients of thermal expansion are eliminated. Formation of a probe card 20 from a material having the same or similar material characteristics as the device wafer 10 under test facilitates effective and efficient burn-in tests at the wafer level.

Figure 7:
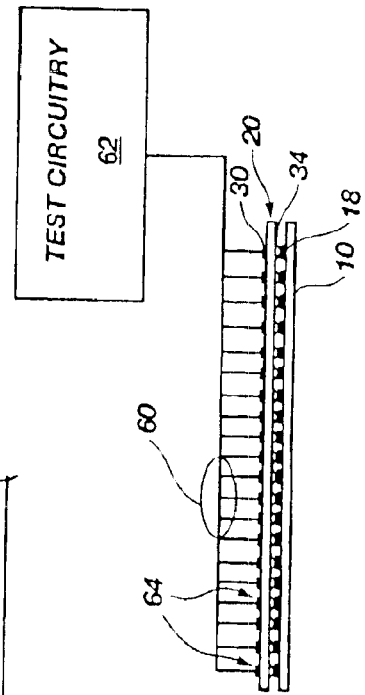
FIG. 7 is a schematic view of the probe card and device wafer showing the probe card coupled with test circuitry.

Referring to FIG. 7, a schematic is shown wherein the probe card 20 is properly positioned on the device wafer 10 achieving electrical contact of cantilever elements 34 with the bond pads 18 as previously illustrated. Electrical connections 60 to external test circuitry 62 extend from test contacts 64 engaged with the individual conductive pads 30 for communication of semiconductor dice 14 on device wafer 10 with external text circuitry 62. Such a configuration for communicating signals from conductive tips 42 of cantilever elements 34 to external test circuitry 62 allows for greater efficiency in testing device wafers 10 of various types and bond pad arrangements, since the pattern of conductive pads 30 may be designed and configured regardless of the required or desired arrangement of cantilever elements 34 to interface with an existing arrangement of test contacts 64 associated with electrical connections 60 of the testing circuitry 62.

As noted throughout the disclosure herein and readily apparent to those of ordinary skill in the art, the present invention provides various advantages in comparison to conventional test equipment, including an ability to perform both burn-in and high frequency testing at the wafer level. Performing such tests at the wafer level provides significant cost savings in properly identifying known good die at an early stage in the fabrication process.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of fabricating at least one test probe on a probe card for testing integrated circuitry, the method comprising:

providing a substrate of semiconducting material;

forming at least one test probe comprising at least one cantilever element from a portion of the semiconducting material of the substrate;

forming a conductive tip proximate a distal end of the at least one cantilever element including forming at least one nonrefractory metal projection proximate the distal end of the at least one cantilever element and forming at least one refractory metal layer over the at least one nonrefractory metal projection and in direct contact therewith;

forming at least one conductive pad on a surface of the substrate other than on the at least one cantilever element; and electrically coupling the conductive tip of the at least one cantilever element with the at least one conductive pad.

2. The method of claim 1, further comprising forming at least one conductive feedthrough extending transversely from a first surface of the substrate to a second surface of the substrate and wherein electrically coupling the conductive tip of the at least one cantilever element with the at least one conductive pad further comprises electrically coupling the conductive tip of the at least one conductive pad to the at least one conductive feedthrough and the at least one conductive feedthrough to the at least one conductive pad.

3. The method of claim 2, further comprising electrically isolating the conductive tip of the at least one conductive element and the at least one conductive pad from the substrate including forming a layer of silicon dioxide between the substrate and each of the conductive tip of the at least one cantilever element, the at least one conductive feedthrough and the at least one conductive pad.

4. The method of claim 2, wherein forming the at least one conductive feedthrough comprises:

forming a channel from the first surface to the second surface;

disposing a first conductive layer in the channel;

disposing an insulative layer in the channel over the first conductive layer; and disposing a second conductive layer in the channel inwardly of the insulative layer and placing the second conductive layer in electrical communication with the conductive tip of the at least one cantilever element and the at least one conductive pad.

5. The method of claim 1, wherein forming a conductive tip proximate a distal end of the at least one cantilever element further comprises removing a portion of the semiconducting material of the substrate.

6. The method of claim 5, wherein removing a portion of the semiconducting material of the substrate is effected by etching.

7. The method of claim 6, wherein etching comprises defining a lateral periphery of the at least one cantilever element by anisotropic etching the semiconducting material of the substrate and undercutting the semiconductor material of the substrate below the defined lateral periphery of the at least one cantilever element by isotropic etching.

8. The method of claim 1, further comprising forming the at least one cantilever element to have a length of approximately 500 to 1000 $\mu$m.

9. The method of claim 8, wherein the at least one test probe is configured for contact with a bond pad on a semiconductor die, and wherein the method further comprises configuring the at least one cantilever element to have a width which is substantially the same as a width of the bond pad.

10. The method of claim 1, wherein forming the at least one refractory metal layer is effected by electroplating, evaporation, or chemical vapor deposition.

11. A method of fabricating a probe card comprising:

providing a substrate of semiconducting material including providing a defective device wafer for use as the substrate, the defective device wafer having at least one defect rendering it nonsuitable for use in fabrication of operable semiconductor dice thereon;

forming a plurality of test probes comprising cantilever elements from portions of the semiconducting material of the substrate;

forming a plurality of conductive pads on a surface of the substrate;

forming a conductive tip adjacent a distal end of each cantilever element; and electrically coupling each conductive tip with at least one conductive pad of the plurality of conductive pads.

12. The method of claim 11, further comprising forming a plurality of conductive feedthroughs extending transversely from a first surface of the substrate to a second surface of the substrate and wherein the electrically coupling each conductive tip with the at least one conductive pad of the plurality of conductive pads further comprises electrically coupling each conductive tip with at least one conductive feedthrough of the plurality of conductive feedthroughs and each conductive feedthrough to the at least one conductive pad of the plurality of conductive pads.

13. The method of claim 12, wherein forming a plurality of conductive feedthroughs comprises:

forming a plurality of channels from the first surface to the second surface;

disposing a first conductive layer in each channel of the plurality;

disposing an insulative layer in each channel over each respective first conductive layer; and disposing a second conductive layer in each channel inwardly of each respective insulative layer and placing each second conductive layer in electrical communication with at least one conductive tip and the at least one conductive pad.

14. The method of claim 12, further comprising electrically isolating each conductive tip and each conductive pad from the substrate including forming a layer of silicon dioxide between the substrate and each conductive tip, each conductive feedthrough and each conductive pad.

15. The method of claim 11, wherein forming the cantilever elements further comprises removing a portion of the semiconducting material of the substrate.

16. The method of claim 15, wherein removing a portion of the semiconducting material of the substrate is effected by etching.

17. The method of claim 16, wherein etching comprises defining a lateral periphery of each cantilever element by anisotropic etching of the semiconducting material of the substrate and undercutting the semiconductor material of the substrate below the defined lateral periphery of each cantilever element by isotropic etching.

18. The method of claim 11, further comprising forming the cantilever elements to have a length of approximately 500 to 1000 $\mu$m.

19. The method of claim 18, wherein the cantilever elements are each configured for contact with a bond pad on a semiconductor die, and wherein the method further comprises configuring the cantilever elements to have a width which is substantially the same as a width of the bond pad.

20. The method of claim 11, wherein forming the conductive tips of the cantilever elements comprises forming at least one metal layer proximate the distal ends of the cantilever elements.

21. The method of claim 20, wherein forming the at least one metal layer comprises forming a plurality of metal layers.

22. The method of claim 21, wherein forming the plurality of metal layers comprises forming a nonrefractory metal layer followed by forming a refractory metal layer thereover and in direct contact therewith.

23. The method of claim 20, wherein forming the at least one metal layer is effected by electroplating, evaporation, or chemical vapor deposition.

24. The method of claim 11, further including configuring the probe card for superimposition over a device wafer having a plurality of semiconductor dice thereon and simultaneous contact of test probes of the probe card with at least some bond pads of each semiconductor die of the device wafer.

25. The method of claim 24, wherein configuring the probe card further comprises arranging the conductive tips of the cantilever elements in a mirror image of a pattern of the at least some bond pads of the semiconductor dice of the device wafer.

26. The method of claim 25, wherein configuring the probe card further comprises grouping the cantilever elements and conductive tips into a plurality of sets, each set being configured for contact with bond pads of an individual semiconductor die of the plurality of semiconductor dice of the device wafer.

27. The method of claim 14, wherein providing a substrate of semiconducting material includes providing a substrate exhibiting a coefficient of thermal expansion which substantially matches a coefficient of thermal expansion of the defective device wafer.

28. A method of forming a probe card comprising:

providing a substrate of semiconducting material having a first surface and a second, opposing surface;

etching a portion of the substrate to form at least one cantilever element from the semiconducting material of the substrate;

forming at least one channel through the substrate from the first surface to the second, opposing surface;

forming an electrically insulative layer over the at least one cantilever element, on an interior surface of the at least one channel, on at least a portion of the first surface of the substrate between the at least one cantilever element and the at least one channel;

depositing a first conductive layer over the electrically insulative layer on the at least one cantilever element, in the at least one channel and between the at least one cantilever element and the at least one channel;

forming a conductive tip on a distal portion of the at least one cantilever element contiguous with the first conductive layer including forming at least one nonrefractory metal projection proximate the distal end of the at least one cantilever element and forming at least one refractory metal layer over the at least one nonrefractory metal projection and in direct contact therewith; and forming a conductive pad on the second, opposing surface in electrical communication with the first conductive layer deposited in the at least one channel.

29. The method of claim 28, further comprising depositing a second conductive layer in the at least one channel prior to depositing the electrically insulative layer.

30. The method of claim 28, wherein etching comprises defining a lateral periphery of the at least one cantilever element by anisotropic etching of the semiconducting material of the substrate and undercutting the semiconductor material of the substrate below the defined lateral periphery of the at least one cantilever element by isotropic etching.

31. The method of claim 28, wherein forming the at least one refractory metal layer is effected by electroplating, evaporation, or chemical deposition.

* * * * *

UNITED STATES PATENT AND TRADEMARK OFFICE
CERTIFICATE OF CORRECTION

PATENT NO. : 6,912,778 B2  Page 1 of 1
APPLICATION NO. : 09/908212
DATED : July 5, 2005
INVENTOR(S) : Ahn et al.

It is certified that error appears in the above-identified patent and that said Letters Patent is hereby corrected as shown below:

On the Title page, in Item (56), under "Other Publications", in column 2, line 9, delete "(KDG)" and insert -- (KGD) --, therefor.

In column 14, line 65, in Claim 31, delete "chemical" and insert -- chemical vapor --, therefor.

Signed and Sealed this

Twenty Second Day of April, 2008

JON W. DUDAS
*Director of the United States Patent and Trademark Office*